United States Patent [19]

Kimura et al.

[11] Patent Number: 5,604,371
[45] Date of Patent: Feb. 18, 1997

[54] SEMICONDUCTOR DEVICE WITH AN INSULATION FILM HAVING AN END COVERED BY A CONDUCTIVE FILM

[75] Inventors: Koji Kimura, Chigasaki; Yuichi Nakashima, Kawasaki; Hiroshi Kawamoto, Yokohama, all of Japan

[73] Assignee: Kabushiki Kaisha Toshiba, Kawasaki, Japan

[21] Appl. No.: 421,795

[22] Filed: Apr. 14, 1995

[30] Foreign Application Priority Data

Apr. 15, 1994 [JP] Japan .................................. 6-101832

[51] Int. Cl.$^6$ ........................ H01L 21/8249; H01L 29/41
[52] U.S. Cl. ........................ 257/378; 257/370; 257/488; 257/630
[58] Field of Search .................................. 257/370, 378, 257/630, 488

[56] References Cited

U.S. PATENT DOCUMENTS

| | | | |
|---|---|---|---|
| 3,999,213 | 12/1976 | Brandt et al. | 257/378 |
| 5,091,322 | 2/1992 | Maeda et al. | 257/203 |
| 5,119,162 | 6/1992 | Todd et al. | 257/370 |

FOREIGN PATENT DOCUMENTS

| | | |
|---|---|---|
| 0203836 | 12/1986 | European Pat. Off. . |
| 2071910 | 9/1981 | United Kingdom . |
| 2086655 | 5/1982 | United Kingdom . |
| 2103877 | 2/1983 | United Kingdom . |
| 2164790 | 3/1986 | United Kingdom . |
| 2190539 | 11/1987 | United Kingdom . |

OTHER PUBLICATIONS

Abstract.

*Primary Examiner*—Jerome Jackson, Jr.
*Attorney, Agent, or Firm*—Finnegan, Henderson, Farabow, Garrett & Dunner, L.L.P.

[57] ABSTRACT

In a semiconductor device, a first conductive film made of, for example, polysilicon is formed on the element region of the semiconductor substrate. An insulation film is formed on the semiconductor substrate, for covering at least the first conductive film. A second conductive film covers at least the end portion of the insulation film. The first conductive film is used as a gate electrode of the MOS transistor, and the second conductive film is used as a protection film for covering and protecting the end portion of the insulation film and a lead-out electrode of the bipolar transistor. The end portion of the insulation film is covered and protected by the second conductive film obtained by patterning the conductive layer made of, for example, polysilicon. Further, the conductive layer is patterned so that stepped portions formed on the insulation film and the end portion of the insulation film are covered, and using this pattern, anisotropic etching is carried out. Thus, formation of residue on the side-wall of the second conductive film, on the stepped portions formed as covering the first conductive film, can be avoided. In a later step, the pattern of the second conductive film which covers the stepped portion is removed by etching.

14 Claims, 5 Drawing Sheets

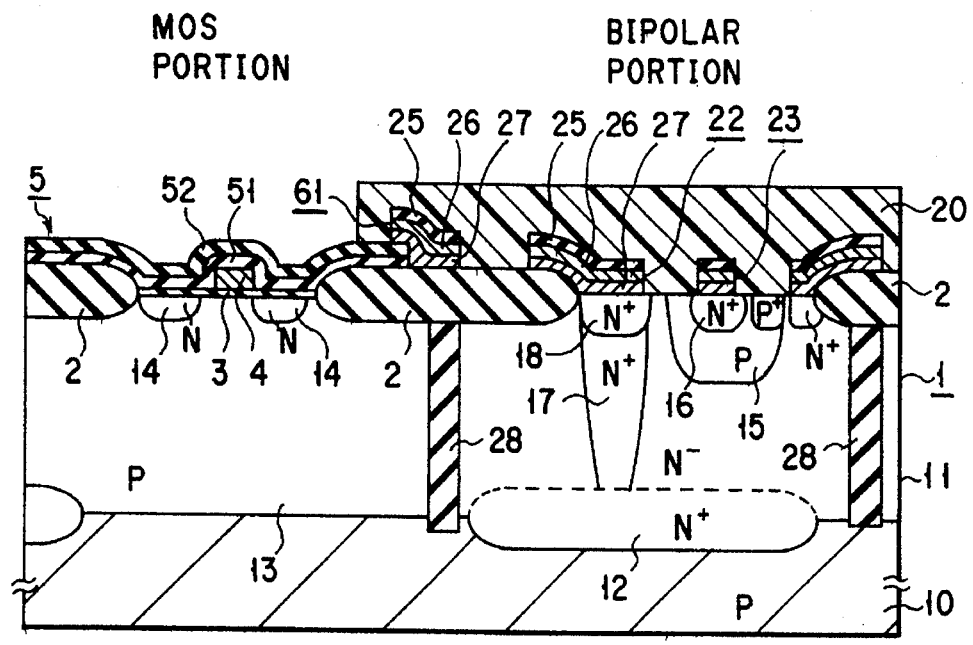
F I G. 10
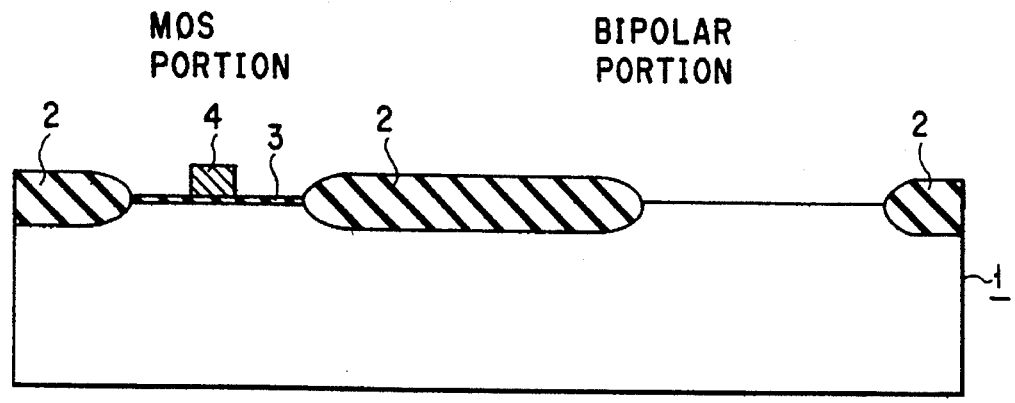
F I G. 11
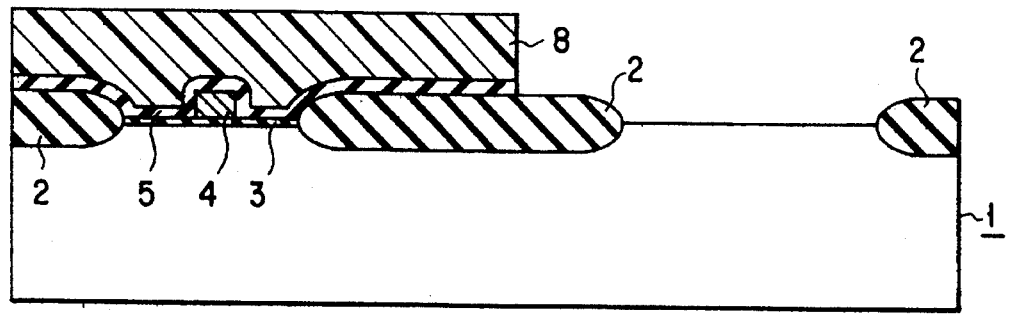
F I G. 12

5,604,371

SEMICONDUCTOR DEVICE WITH AN INSULATION FILM HAVING AN END COVERED BY A CONDUCTIVE FILM

BACKGROUND OF THE INVENTION

1. Field of the Invention

The present invention relates to a semiconductor device such as a BiCMOS device having two or more conductor films used for a wiring portion and an electrode, on its semiconductor substrate, and a method of manufacturing the same.

2. Description of the Related Art

A multi-layer conductive film formed on the main surface of a semiconductor substrate via an interlayer insulation film is used as a wiring portion for electrically connecting an electrode of a semiconductor element, or semiconductor elements with each other. In accordance with a further increase in high integration or further downsizing of semiconductor devices such as IC and LSI, a more fine and complicated pattern is formed on a semiconductor substrate. If, for example, an interlayer insulation film is formed on a surface of a semiconductor substrate on which a fine pattern has been formed, many stepped portions, which result due to the pattern, are formed on the surface. In order to form an electrode or a wiring pattern, made of polysilicon, on an interlayer insulation film on which many stepped portions have been created, a conductive layer made of, for example, polysilicon is formed on the entire surface of an interlayer insulation film, and the conductive layer is etched into a predetermined pattern using an anisotropic etching technique such as RIE, thus forming electrodes and wiring patterns. However, if the anisotropic etching technique such as RIE (reactive ion etching) is used for the conductive layer on such a stepped interlayer insulation film, undesired residue of the conductive layer is likely to result on a side wall portion of a stepped portion while forming a predetermined conductive pattern. Such residue may shortcircuit the integrated circuit and lower the production yield. Conventionally, the following methods are used in order to prevent residue from being created.

i) Removal of residue on side wall of stepped portion by excessive over-etching:

This method may be used without problem if drawback entailed in the method is not created. However, with the downsizing of semiconductor devices, if an underlayer is over-etched, a decrease in the pattern conversion difference is rendered no longer negligible.

ii) Removal of residue on side wall of stepped portion in a different step later:

In this method, the residue is peeled off to be dust in a step prior to the residue removal step, thus lowering the production yield of the semiconductor device. In particular, with reduced-size LSIs, a critical decrease in yield may result.

iii) Removal of undesired film formed on stepped portion prior to the anisotropic etching step:

This method is effective in the case where an isotropic etching method capable of selectively and highly controllably removing a film to be removed, from an underlayer. However, in the case where an appropriate isotropic etching method cannot be applied, or where a film to be etched has a laminated structure, which entails a large difference in etching rate while isotropic etching being performed, excessive under-cut occurs, creating the problem of peeling of pattern.

The following is an explanation of a conventional method of producing a BiCMOS device made by the first and second methods, in which the first layer, which is a polysilicon film, is formed into a gate film and the second layer, which is a polysilicon film, is formed into a base lead-out electrode.

First, the first method of removing residue on a side wall by excessive over-etching will now be described with reference to FIGS. 11 to 13.

As shown in FIG. 11, a field oxide film 2 is formed on an element separation region of a silicon semiconductor substrate 1 by an LOCOS method. A gate oxide film 3, which is a heat oxide film made of, for example, silicon, is formed on an element region of a MOS transistor portion on the silicon semiconductor substrate 1. On the gate oxide film 3, a polysilicon gate electrode 4 having a predetermined pattern, which serves as the first conductive film, is formed (FIG. 11). Next, a silicon oxide film ($SiO_2$) having a thickness of about 100 nm is deposited by the CVD method. Then, the silicon oxide film is etched by a photo-etching method in such a manner that the gate electrode 4 is covered by a photoresist 8, thereby removing the undesired portion of the silicon oxide film. Thus, a silicon oxide film 5 is formed, as shown in FIG. 12. In this figure, the photoresist 8 used for the etching process is formed on the remaining silicon oxide 5. Then, the photoresist 8 is removed.

Next, as shown in FIG. 13, a second layer polysilicon film having a thickness of about 3000 nm, which serves as the second conductive film, is deposited. Then, a photoresist 9 is formed on the second polysilicon film so as to cover a region for forming a base lead-out electrode of a bipolar transistor, in the element region of a bipolar transistor portion. After that, with the photoresist 9 serving as a mask, the polysilicon film is excessively over-etched by an anisotropic etching technique such as RIE, so as to form a base lead-out electrode 6 of the bipolar transistor (FIG. 13). With this method, the following problems arise, that is, (A) a decrease in thickness of the field oxide film 2 and silicon oxide film 5 by over-etching; (B) over-etching of a bipolar portion semiconductor substrate exposed portion; and (C) an increase in the pattern conversion difference of the polysilicon film serving as the second conductive film.

Next, an example of the method of removing only the residue on the side wall of a stepped portion in a different step later will now be described with reference to FIGS. 11, 12, 14 and 15. As shown in FIG. 11, a field oxide film 2 is formed on an element separation region of a silicon semiconductor substrate 1 by an LOCOS method. A gate oxide film 3, which is a heat oxide film made of, for example, silicon, is formed on an element region of a MOS transistor portion on the silicon semiconductor substrate 1. On the gate oxide film 3, a polysilicon gate electrode 4 having a predetermined pattern, which serves as the first conductive film, is formed (FIG. 11). Next, a silicon oxide film ($SiO_2$) having a thickness of about 100 nm is deposited by the CVD method. Then, the silicon oxide film is etched by a photo-etching method so as to cover the gate electrode 4, thereby removing the undesired portion of the silicon oxide film. Thus, a silicon oxide film 5 is formed, as shown in FIG. 12. In this figure, the photoresist 8 used for the etching process is formed on the remaining silicon oxide film 5. Then, the photoresist 8 is removed. Next, a second layer polysilicon film having a thickness of about 3000 nm, which serves as the second conductive film, is deposited. Then, a photoresist 9 is formed on the second polysilicon film so as to cover a region for forming a base lead-out electrode of a bipolar transistor, in the element region of a bipolar transistor portion.

Then, with the photoresist 9 being used as a mask, the polysilicon film is etched by anisotropic etching such as RIE, thus forming a base lead-out electrode 6 of the bipolar transistor. During this etching, residues 7 of the polysilicon film 6 are formed on the side wall of the stepped portion of the silicon oxide film 5, formed by the gate electrode 4 and the stepped portion of an end of the pattern of the silicon oxide film 5. In a later step, the silicon oxide film 5 is etched, thereby removing the polysilicon film residue. Or, in a later heat process, the polysilicon film residue peels off from the silicon oxide film due to the difference in thermal expansion coefficient between the underlayer and the second conductive film (FIG. 15). In any case, the conventional method of removing residue on the side wall of the polysilicon film serving as the second conductive film, requires much labor to carry out. Thus, it is difficult to handle the residue as dust, which causes deterioration of the quality of the product. The above explanation is made in connection with the case of a polysilicon film; however basically the same explanation can be made in the case of a conductive film of a laminated structure in which the second conductive film consists of a polycide film of a laminated body including a polysilicon film and a titanium silicide formed thereon, and a CVDSiO$_2$ film applied on the polycide film. In this case, for example, residue which is complicatedly shaped due to a combination of residue pieces of the three films, is formed on the stepped portion of the side wall of a gate electrode.

Further, in the element region of the semiconductor substrate, for example, the gate electrode of the first conductive film formed on the element region on which a MOS transistor is formed, is coated with an insulation film such as the silicon oxide film 5 shown in FIG. 15. This insulation film is not formed in the element region in which a bipolar transistor is formed. That is, the silicon oxide film 5 which is an insulation film, is formed in the element region of the MOS transistor portion, and the silicon oxide film 5 extends onto the field oxide film 2 which is the element separation region. However, the silicon oxide film 5 is exposed to a stress is a heat process later, and a particularly large stress is applied to the end portion of the film. The silicon oxide film 5 may peel off from its end portion during the process of the product or after the completion of the product, thereby causing an increase in the number of defective products. Especially, the residue on the side wall of the polysilicon film is formed also on the peripheral end portion (not shown) of the silicon oxide film 5, and therefore when removing the residue, the silicon oxide film may peel off.

The present invention has been proposed in consideration of the above-described circumstances, and an object thereof is to provide a semiconductor device in which the insulation film covering the conductive film formed on the element region is prevented from being exposed to stress and does not easily peels from its end portion, thus suppressing deterioration of the characteristics, at a high yield rate. Another object thereof is to provide a method of producing a semiconductor device, in which anisotropic etching is carried out so as to avoid formation of side-wall residue, which peels off at a later step and serves as dust.

According to the present invention, there is provided a semiconductor device comprising: a semiconductor substrate having a first element region and a second element region; an insulation film formed on the first element region of the semiconductor substrate, having an end portion extending to a region of the semiconductor substrate which is between the first element region and the second element region; a conductive film formed on the end portion, extending onto the insulation film and the semiconductor substrate; and a wiring film formed on the second element region, the wiring film and the conductive film being formed by patterning a common film, and the wiring film and the conductive film being electrically insulated from each other.

According to the present invention, there is further provided a method of manufacturing a semiconductor device, comprising the steps of: preparing a semiconductor substrate having a first element region and a second element region; forming an insulation film on the first element region of the semiconductor substrate, having an end portion extending to a region of the semiconductor substrate which is between the first element region and the second element region; and forming a conductive film on the end portion, extending onto the insulation film and the semiconductor substrate, and a wiring film on the second element region, by patterning a common film.

According to the present invention, there is still further provided a method of manufacturing a semiconductor device, comprising the steps of: preparing a semiconductor substrate having a first element region and a second element region, a projecting film being formed on the first element region of the semiconductor substrate and projected from the first element region; forming an insulation layer over the semiconductor substrate; patterning the insulation layer to form an insulation film covering the projecting film and having an end portion extending to a region of the semiconductor substrate which is between the first element region and the second element region; forming a conductive layer over the semiconductor substrate; forming on the conductive layer, a mask film covering a step portion of the conductive layer which is caused at an edge portion of the projecting film, a mask film covering a step portion of the conductive layer which is caused at the end portion of the insulation film, and a mask film covering a portion of the second element region; patterning the conductive layer by an unisotropic etching, using the mask films, to form a conductive film covering the step portion of the conductive layer which is caused at an edge portion of the projecting film, a conductive film covering the step portion of the conductive layer which is caused at the end portion of the insulation film, and a wiring film covering the portion of the second element region; removing the mask films; forming a mask film on the second element region, covering the wiring layer and the conductive film covering the step portion of the conductive layer which is caused at the end portion of the insulation film; removing the conductive film covering the step portion of the conductive layer which is caused at the edge portion of the projecting film by an isotropic etching, using the mask film; and removing the mask film.

According to the present invention, there is yet further provided a semiconductor device comprising: a semiconductor substrate; a semiconductor layer formed on the semiconductor substrate, the semiconductor layer including a MOS transistor region and a bipolar transistor region; a buried layer formed between the semiconductor substrate and the semiconductor layer; an isolation film pattern formed on the semiconductor layer; a source and a drain regions formed in the MOS transistor region of the semiconductor layer; a first conductive film pattern formed in the MOS transistor region of the semiconductor layer, forming a gate electrode; an insulative film pattern formed on the MOS transistor region of the semiconductor layer, covering the first conductive film pattern and having an end portion extending to the isolation film pattern; and a second conductive film pattern having a first conductive portion and a second conductive portion electrically disconnected to each other, the first conductive portion being formed on the bipolar transistor region of the semiconductor layer and the second conductive portion being formed on the isolation film pattern, the first conductive portion forming a base electrode and being connected to a power source potential, and the second conductive portion covering the end portion of the insulative film pattern and being electrically floating.

According to the present invention, there is further provided a semiconductor device comprising: a semiconductor substrate; a semiconductor layer formed on the semiconductor substrate, the semiconductor layer including a MOS transistor region and a bipolar transistor region; a buried layer formed between the semiconductor substrate and the semiconductor layer; an isolation film pattern formed on the semiconductor layer; a source and a drain regions formed in the MOS transistor region of the semiconductor layer; a first conductive film pattern formed in the MOS transistor region of the semiconductor layer, forming a gate electrode; a first insulative film pattern formed on the MOS transistor region of the semiconductor layer, covering the first conductive film pattern and having an end portion extending to the isolation film pattern; a second insulative film pattern formed on the MOS transistor region, covering the first insulative film; a second conductive film pattern having a first conductive portion and a second conductive portion electrically disconnected to each other, the first conductive portion being formed on the bipolar transistor region of the second semiconductor layer and the second conductive portion being formed on the isolation film pattern, the first conductive portion forming a base electrode and being connected to a power source potential, and the second conductive portion covering the end portion of the insulative film pattern and being electrically floating; a third conductive film pattern having a third conductive portion and a fourth conductive portion, the third conductive portion and the fourth conductive portion being formed on the first conductive portion and the second conductive portion, covering the first conductive portion and the second conductive portion, respectively; and a third insulative film pattern having a first insulative portion and a second insulative portion, the first insulative portion and the second insulative portion being formed on the third conductive portion and the fourth conductive portion, covering the third conductive portion and the fourth conductive portion, respectively.

According to the provided invention, there is still further provided a method of manufacturing a semiconductor device, comprising the steps of: preparing a semiconductor layer formed on a semiconductor substrate, the semiconductor layer having a first device region, a second device region and an isolation film pattern between the first and the second device regions; forming a first conductive film pattern on the first device region; forming an insulative film pattern on the first conductive film pattern, the insulative film pattern having an end portion extending to the isolation film pattern; forming a conductive layer over the semiconductor layer; forming first mask film patterns on first portions of the conductive layer which are on the first device region and the edge portion of the isolation film patter; etching second portions of the conductive layer which are other than the first portions, by anisotropic etching using the first mask film patterns; removing the first mask film patterns; forming a second mask film pattern on third portions of the conductive layer which are on the second device portion and the end portion of the insulative film pattern; and etching fourth portions of the conductive layer which are other than the third portions, by isotropic etching using the second mask film patterns.

According to the present invention, there is yet further provided a method of manufacturing semiconductor device, comprising the step of: preparing a semiconductor substrate of a first conductive type; implanting an impurity of a second conductive type into a surface of the semiconductor substrate; growing a semiconductor layer on the semiconductor substrate, for forming a buried layer of the second conductive type by defusing the impurity; boring the semiconductor layer for making a trench reached to the semiconductor substrate; oxidizing a surface of the semiconductor layer including at least an opening of trench, for shaping a field oxide, the field oxide dividing the surface of the semiconductor layer, for building up a first device region and a second device region in the surface of the semiconductor layer, and the second device region being formed upon the buried layer; implanting an impurity of the first conductivity type into the first device region; implanting an impurity into a surface of the first device region, for forming a source region and a drain region; oxidizing the surface of the first device region, for forming a gate insulation film; processing a gate electrode on the gate insulation film; implanting an impurity in the second device region, for constituting a collector region; implanting an impurity in the second device region, for constituting a base region; implanting an impurity in the second device region, for constituting an emitter region; forming an insulative film pattern on the gate electrode, the insulative film pattern having an end portion extending to the field oxide; forming a conductive layer over the semiconductor layer; forming first mask film patterns on first portions of the conductive layer which are upon the first device region, the edge portion of the insulation film, the base region, and emitter region; etching second portions of the conductive layer which are other than the first portions, by anisotropic etching using the first mask film patterns; removing a said first mask film patterns; forming second mask film pattern on third portions of the conductive layer which are on the second device region and the end portion of the insulation film; and etching forth portions of the conductive layer which are other than the third portions, by isotropic etching using the second mask film pattern.

The end portion of the insulation film is coated and protected by the conductive film obtained by patterning the conductive layer, and therefore the insulation film is prevented from being exposed to stress and does not easily peels from the semiconductor substrate. Moreover, since the protection film extends onto the insulation film and the semiconductor substrate, the protection film does not peels off from the films so that the conventional dust problem does not occur. Further, when patterning the conductive layer, the pattern is formed so that the stepped portion formed on the insulation film and the end portion of the insulation film are covered and anisotropic etching is carried out. Thus, the formation of the side-wall residue of the conductive film is avoided. Then, in a later step, the pattern of the conductive film which covers the stepped portion is removed by etching.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a cross section of a semiconductor device according to the second embodiment;

FIG. 11 is a cross section illustrating a production step in manufacturing a conventional semiconductor device;

FIG. 12 is a cross section illustrating another production step in manufacturing the conventional semiconductor device;

DETAILED DESCRIPTION OF THE PREFERRED EMBODIMENTS

Embodiments of the present invention will now be described with reference to accompanying drawings.

Figure 8:
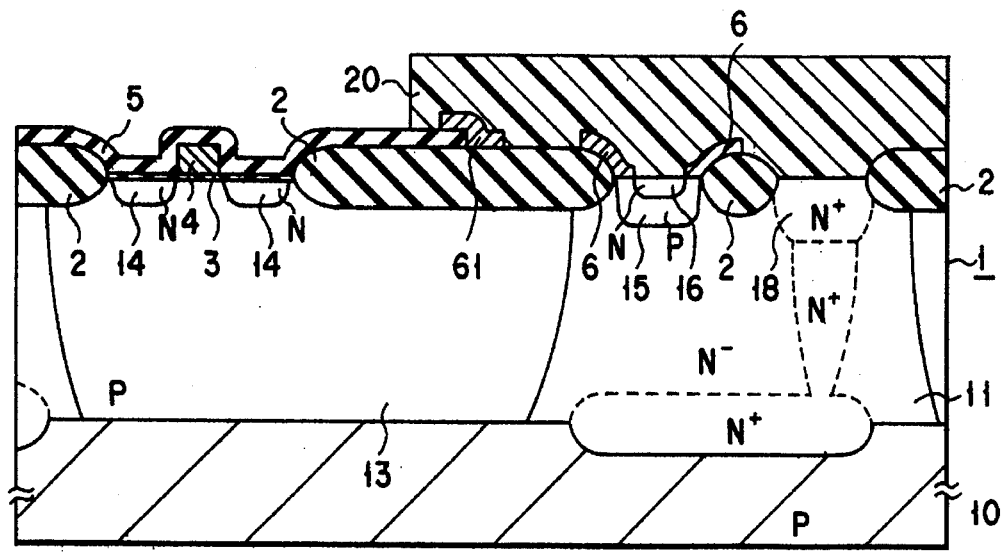
FIG. 8 is a cross section illustrating a production step in manufacturing the semiconductor device according to the first embodiment.

First, the first embodiment will be described with reference to FIGS. 1 and 8. These figures illustrate a MOS transistor portion of a BiCMOS device and a bipolar transistor portion located adjacent thereto. In this embodiment, the explanation will be provided in connection with the case where an NMOS transistor of a CMOS circuit and an NPN bipolar transistor adjacent thereto are used.

Figure 1:
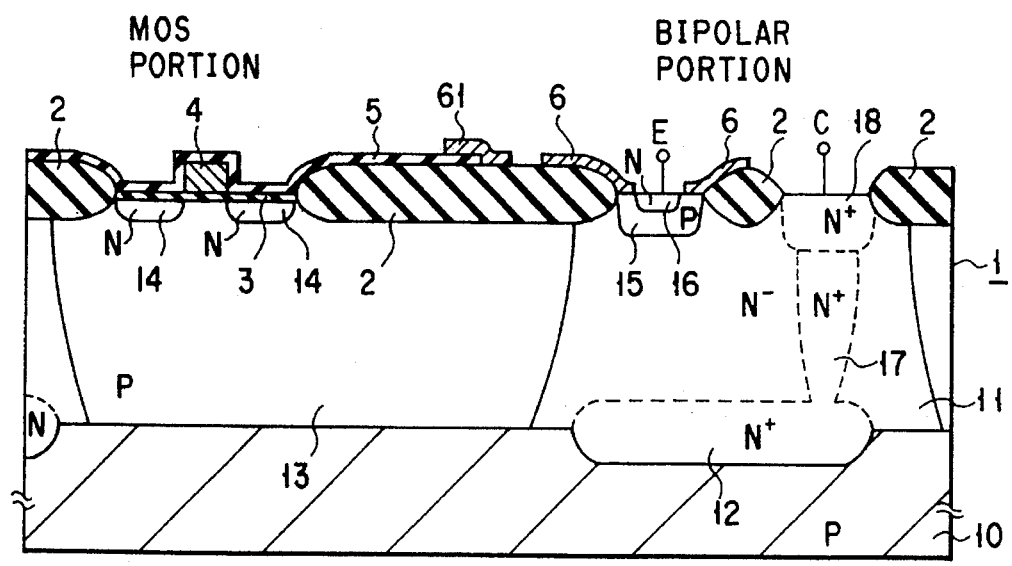
FIG. 1 is a cross section of a semiconductor device according to the first embodiment.

FIG. 1 is a cross section of a semiconductor device, and as shown in this figure, a so-called epitaxial wafer is used as a semiconductor substrate 1, the wafer consisting of a P-type silicon semiconductor substrate 10 and an $N^-$-silicon epitaxial layer 11 grown on the substrate 10. An $N^+$ impurity diffusion buried region 12 is formed at a predetermined region on the surface of the silicon semiconductor substrate 10. This buried region 12 is covered by the epitaxial layer 11, and buried in the bipolar transistor portion and the PMOS transistor portion (not shown). A field oxide film 2, which serves as an element separation region, is formed on the surface of the epitaxial layer 11. Impurities are diffused into the NMOS transistor portion (MOS portion in the figures) so as to form a P well 13, and the NMOS transistor is formed in the P well. In the P well, an N-type impurity diffusion region 14 to serve as source/drain regions of the NMOS transistor is formed. The source/drain regions may be of an LDD structure.

On a region of the semiconductor device 10, located between the source/drain regions 14, a gate electrode 4 made of, for example, polysilicon, is formed via a gate oxide film 3. The gate electrode 4 is formed from the first conductive film on the semiconductor substrate 1. The surface of the NMOS transistor portion including the gate electrode 4 is covered by an insulation film 5 such as a silicon oxide film, having a thickness of about 100 to 200 rim, and formed by CVD (chemical vapor deposition). This insulation film 5 is stretched on the field oxide film 2 of the element separation region, and the end portion thereof is limited on the flat surface portion of the field oxide film 2. The end portion of the insulation film 5 on the field oxide film 2 is covered by the polysilicon film 61. The polysilicon film 61 prevents the end portion of the insulation film 5 from being exposed to stress during, in particular, a later heat step. The polysilicon film 61 also serves as a protection film designed to prevent the peeling-off of the insulation film. The polysilicon film 61 consists of the second conductive film. The protection film 61 is electrically floating. The protection film 61 is stretched on the upper surface of the insulation film 5 so as to function as a protection film. The protection film 61 is also stretched on the field oxide film so as to have a support for itself to the semiconductor structure.

On the other hand, in the NPN bipolar transistor portion (bipolar portion in the figure), a P-type impurity diffusion region 15 serving as a base region is formed, and an N-type impurity diffusion region 16 serving as an emitter region is formed within the base region. The buried region 12 formed in the bipolar transistor portion is connected to a deep $N^+$ impurity diffusion region 17 used as a collector region, and the impurity diffusion region 17 is connected to a collector electrode lead-out region 18 formed on the surface of the semiconductor substrate 1. The electrode 6 of the base region 15 is made of a polysilicon film, and from the second conductive film.

As described, the second conductive film consists of the base electrode 6 and the protection film 61. The base electrode 6 is connected to a power source potential, through not shown. The protection film 61 is electrically floating. An emitter electrode E and a collector electrode C are connected to the emitter region 16 and the collector electrode lead-out region 18, respectively. These electrodes E and C are metal electrodes such as of Al, and are connected to an Al wiring portion made of the third or higher conductive film (not shown), formed on the second conductive film via an interlayer insulation film. The emitter electrode E is connected to a power source potential, and the collector electrode C is connected to a power source potential. The surface of the semiconductor substrate 1 is coated and protected by a passivation film (not shown).

The emitter electrode E and the collector electrode C may be formed from the second conductive film. In this case, the base electrode is made of metal such as Al.

As described, the end portion of the insulation film 5 which covers the gate electrode 4 which is the first conductive film formed on the MOS transistor portion is covered by the protection film 61 of the second conductive film obtained by patterning the conductive layer formed on the entire surface of the semiconductor substrate. Therefore, the end portion of the insulation film is prevented from being exposed to stress. Furthermore, the insulation film does not easily peels off from the surface of the semiconductor substrate, thus remarkably lowering the defective product rate. The insulation film 5 is not limited to the CVDSiO$_2$ film, but may be a two-layered Si$_3$N$_4$/SiO$_2$ film which uses a CVDSi$_3$N$_4$ film or a silicon nitride as an underlayer. The gate electrode is not limited to polysilicon, but may be of some other available material such as a polycide film of a laminated body including a polysilicon film and a titanium silicide film formed thereon. The second conductive film may be of, other than a polysilicon film, a refractory metal such as Ti, W, Mo etc., a metal, a polycide film, or a polycide/SiO$_2$ film obtained by covering a polycide film by a SiO$_2$ film. Si$_3$N$_4$ is strong against stress and, thus when the insulation film 5 is made of Si$_3$N$_4$, the peel-off of the insulation film 5 can effectively be supported. When a single film structure is used for the second conductive film, the end portion of the insulation film 5 can be more effectively prevented from the peel-off.

Figure 2:
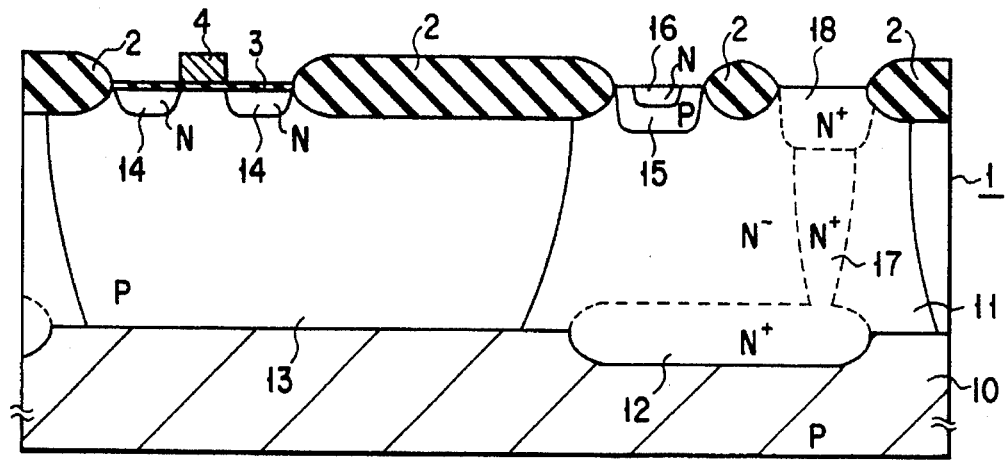
FIG. 2 is a cross section illustrating a production step in manufacturing the semiconductor device according to the first embodiment.
Figure 3:
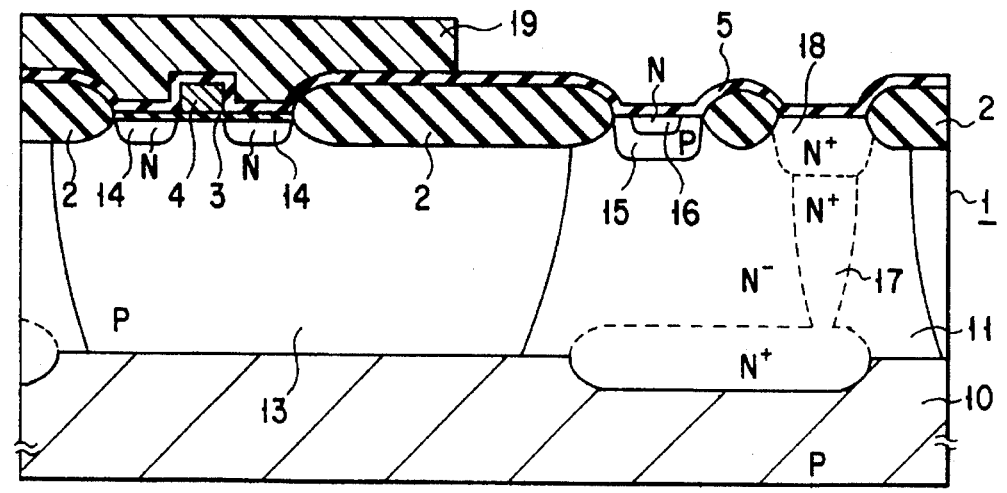
FIG. 3 is a cross section illustrating another production step in manufacturing the semiconductor device according to the first embodiment.

Next, a method of manufacturing a semiconductor device, according to the first embodiment, will now be described with reference to FIGS. 2 to 8. As shown in FIG. 2, the semiconductor substrate 1 consists of a P-type silicon semiconductor substrate 10 and an N$^-$ silicon epitaxial layer 11. An N$^+$ buried region 12 is formed in a predetermined region of the surface of the silicon semiconductor substrate 10. An element separation field oxide film 2 is formed on the surface of the epitaxial layer 11. An N-type source/drain regions 14 are formed in the P well 13 of the MOS transistor portion. A polysilicon gate electrode 4 is formed at a region between the N-type source/drain regions 14, located on the semiconductor substrate, via the gate oxide film 3 obtained by heat oxidation of silicon. The gate electrode 4 is formed from the first conductive film on the semiconductor substrate 1. On the other hand, a P-type base region 15 is formed on the NPN bipolar transistor portion, and an N-type emitter region 16 is provided in the base region. The buried region 12 is connected to the deep N$^+$ impurity diffusion region 17 of the collector region, and the diffusion region 17 is connected to the N$^+$ collector electrode lead-out region 18. As shown in FIG. 3, for example, a silicon oxide film (SiO$_2$) having a thickness of 100 nm is deposited by CVD on the entire surface of the semiconductor substrate 1 including the gate electrode 4. Then, a photoresist 19 having a predetermined pattern is formed thereon so as to cover the gate electrode 4 and the end portion of the field oxide film 2. The photoresist 19 is limited on, i.e., extends onto, the upper surface of the field oxide film 2.

Figure 4:
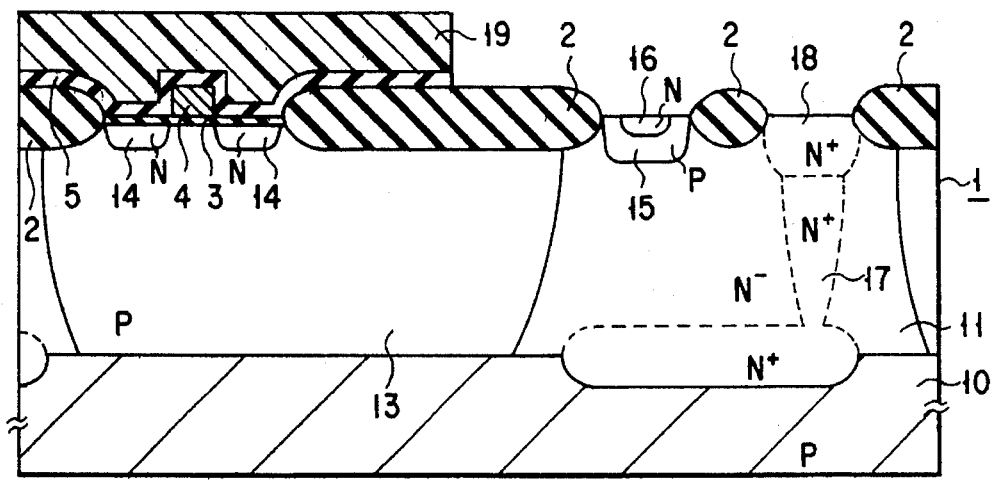
FIG. 4 is a cross section illustrating another production step in manufacturing the semiconductor device according to the first embodiment.
Figure 5:
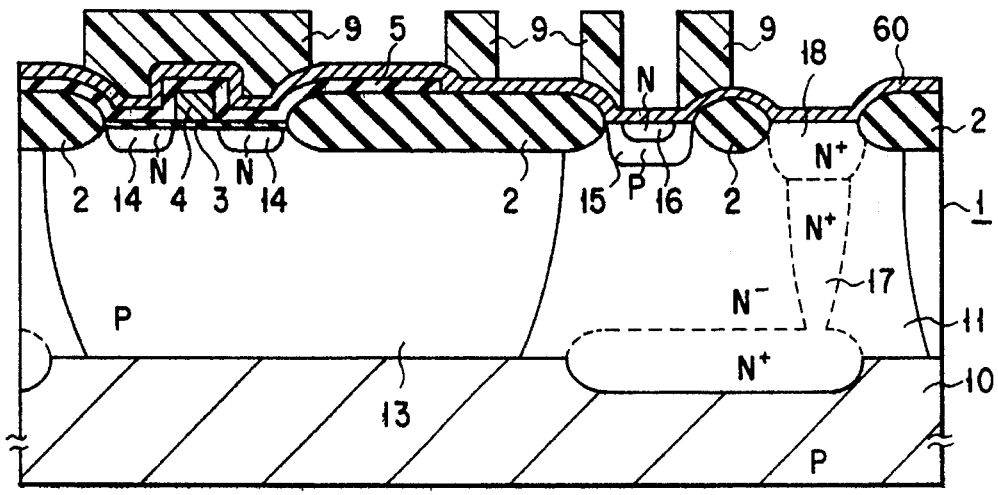
FIG. 5 is a cross section illustrating another production step in manufacturing the semiconductor device according to the first embodiment.
Figure 6:
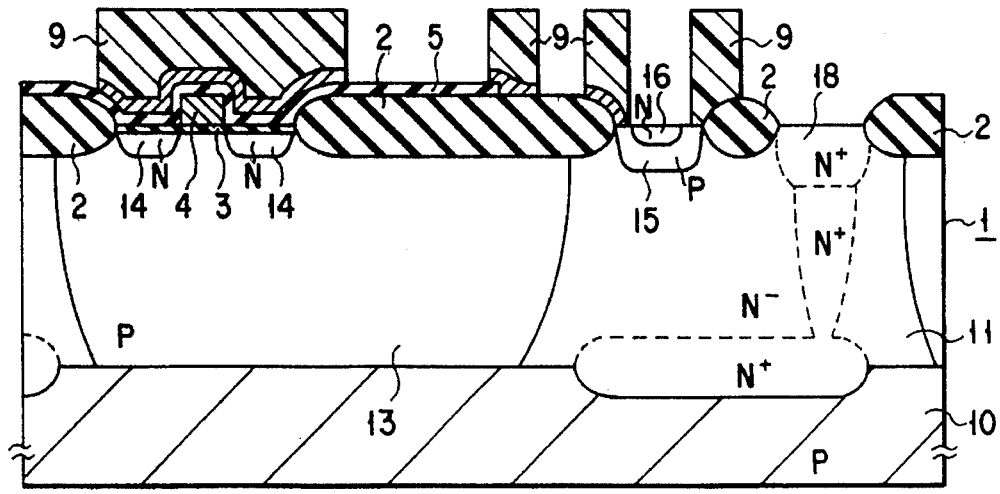
FIG. 6 is a cross section illustrating a production step in manufacturing the semiconductor device according to the first embodiment.
Figure 7:
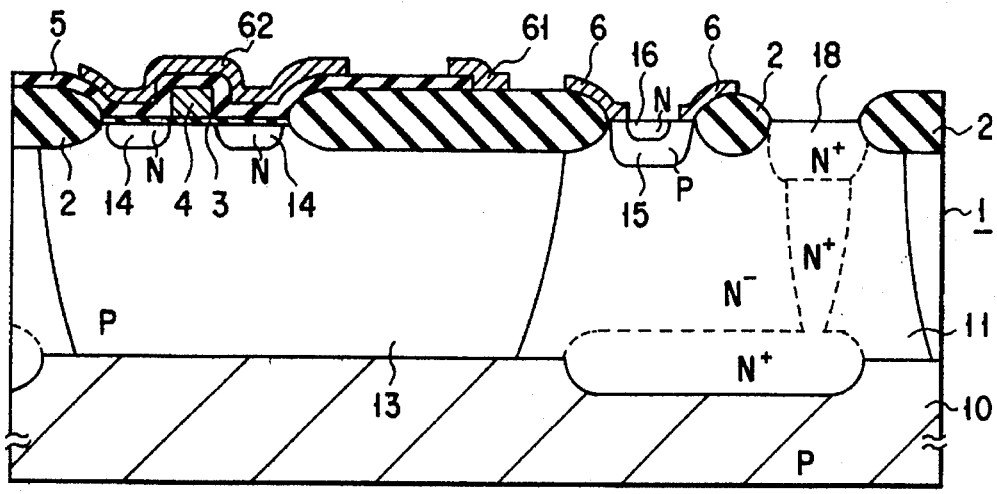
FIG. 7 is a cross section illustrating a production step in manufacturing the semiconductor device according to the first embodiment.

Next, as shown in FIG. 4, the silicon oxide film 5 is etched using the photoresist 19 as a mask, and the silicon oxide film portion formed on the NPN bipolar transistor portion and on a part of the field oxide film 2 is removed by etching. Next, after removing the photoresist 19, a polysilicon film 60 having a thickness of about 3000 nm, which is the second layer, is deposited as shown in FIG. 5, and a photoresist 9 having a predetermined pattern is formed so as to cover the base lead-out electrode forming region of the NPN bipolar transistor portion, the gate electrode 4, the end portion of the field oxide film 2, and the end portion of the silicon oxide film 5. Next, as shown in FIG. 6, the polysilicon film 60 is selectively removed by etching using the photoresist 9 as a mask. In order to etch the polysilicon film 6, an anisotropic etching technique such as RIE is employed. By using an anisotropic etching, the pattern accuracy can be advanced. Next, the photoresist 9 is removed. By this etching process, the polysilicon film 60, which is the second layer, is divided into a protection film 61 for protecting the base lead-out electrode 6 and the end portion of the field oxide film 2, and a polysilicon film 62 for covering the end portion of the field oxide film 2. Next, as shown in FIG. 8, a photoresist 20 having such a pattern that the protection film 61 for protecting the end portion of the silicon oxide film 5, and the base lead-out electrode 6 are covered, and the polysilicon film 62 for covering the gate electrode 4 and the end portion of the field oxide film 2 is exposed, is formed on the semiconductor substrate 1, and using this photoresist 20 as a mask, the polysilicon film 62 is removed by etching. This process is carried out by the isotropic down-flow type plasma etching method using, for example, CF$_4$ and O$_2$. With this method, polysilicon residue, which is easily formed on the side wall of the stepped portions of the silicon oxide film 5, formed by the end portion of the gate electrode 4 or the field oxide film 2, is not produced, and therefore the second conductive film consisting of the protection film 61 for protecting the end portion of the silicon oxide and the base lead-out electrode 6 can be accurately formed. It should be noted that the method is not limited to the down-flow type plasma etching, but an arbitrary isotropic etching method may be used.

Figure 9:
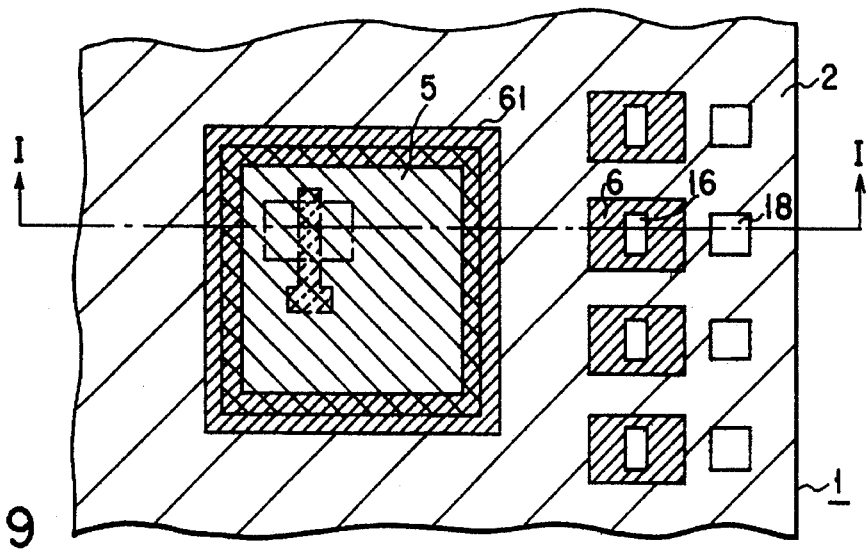
FIG. 9 is a plan view of the semiconductor device shown in FIG. 1.
Figure 13:
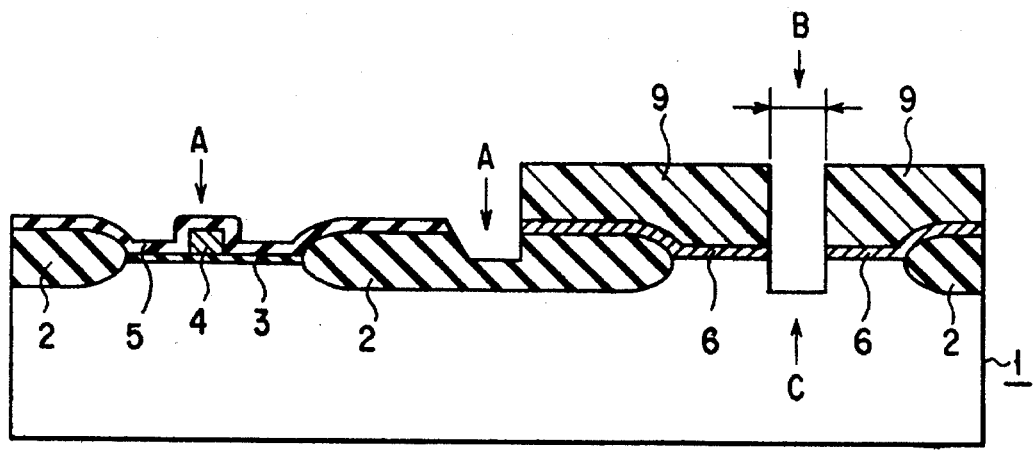
FIG. 13 is a cross section illustrating another production step in manufacturing the conventional semiconductor device.
Figure 14:
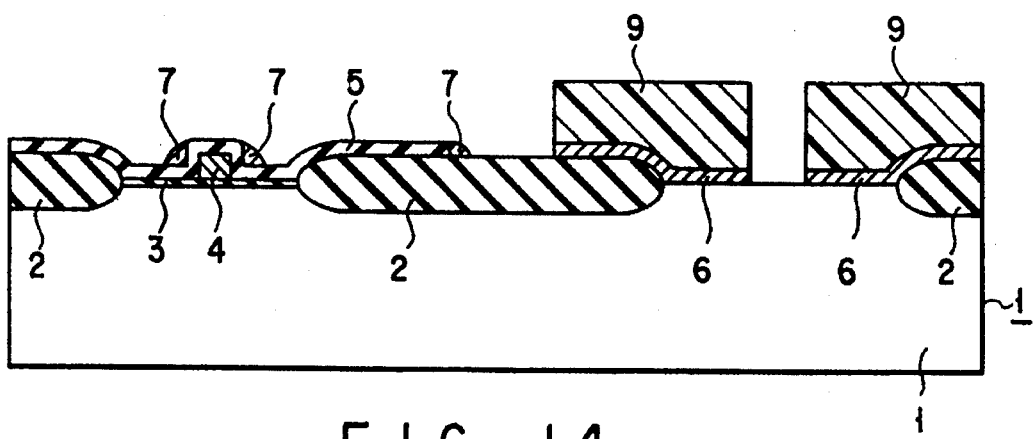
FIG. 14 is a cross section illustrating another production step in manufacturing the conventional semiconductor device.
Figure 15:
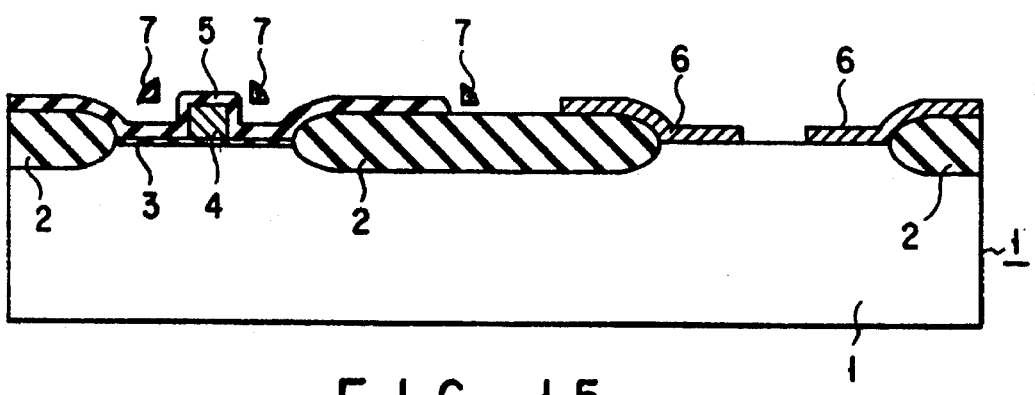
FIG. 15 is a cross section illustrating another production step in manufacturing the conventional semiconductor device.

FIG. 9 is a plan view of the semiconductor device. As shown in FIG. 9, the entire periphery of the MOS region is surrounded by the protection film 61. With the structure, residue of the conductive layer does not occur, and further, stress and peel-off of the insulation film can be more effectively suppressed. The MOS region is situated nearer the center of the semiconductor substrate than the bipolar region is.

The second embodiment will now be described with reference to FIG. 10.

FIG. 10 is a cross section of a semiconductor device, and illustrates a MOS transistor portion of a BiCMOS device and a bipolar transistor portion adjacent thereto. In this embodiment, the explanation will be provided in connection with the case where an NMOS transistor of a CMOS circuit and an NPN bipolar transistor adjacent thereto are used. A semiconductor substrate 1 consists of a P-type silicon semiconductor substrate 10 and an N$^-$ silicon epitaxial layer 11 grown thereon. An N$^+$ impurity diffusion buried region 12 is formed at a predetermined region on the surface of the silicon semiconductor substrate 10. This buried region 12 is covered by the epitaxial layer 11, and buried in the bipolar transistor portion. A field oxide film 2, which serves as an element separation region, is formed on the surface of the epitaxial layer 11. The element separation region consists of the field oxide film 2 and a trench 28 formed underneath the field oxide film, and filled with an insulating material such as SiO$_2$.

Impurities are diffused into the NMOS transistor portion (MOS portion in the figures) so as to form a P well 13, and a NMOS transistor is formed therein. In the P well 13, an N-type source/drain regions 14 of the NMOS transistor is formed. A gate electrode 4 made of, for example, polysilicon, is formed at a position between the source/drain regions 14, located on the semiconductor substrate, via the gate oxide film 3.

The gate electrode 4 is formed from the first conductive film on the semiconductor substrate 1. The surface of the NMOS transistor portion including the gate electrode 4 is covered by an insulation film 5. The insulation film 5 consists of an SiO$_2$ film 51 having a thickness of 150 nm and formed by the CVD method, and an Si$_3$N$_4$ film 52 having a thickness of 100 nm, and formed on the film 51. This insulation film 5 is stretched on the field oxide film 2 of the element separation region, and the end portion thereof is limited on the field oxide film 2. The end portion of the insulation film 5 on the field oxide film 2 is covered by the polysilicon film 61 made from the second conductive film. The second conductive film 61 consists of the polycide films 26 and 27, and the SiO$_2$ film 25 formed thereon, and the polycide film consists of the polysilicon film 27 and a TiSi$_2$ film 26 formed thereon. As in the first embodiment, the protection film 61 is floating in terms of potential. The protection film 61 is stretched on the upper surface of the insulation film 5 so as to function as a protection film. The protection film 61 is also stretched on the field oxide film so as to have a support for itself to the semiconductor structure. The polycide film structure reduces the resistivity of the film to increase the operation speed of the semiconductor device.

On the other hand, in the NPN bipolar transistor portion, a P-type base region 15 is formed, and an N-type emitter region 16 is formed within the base region. A collector electrode lead-out region 18 is formed on the surface of the semiconductor substrate 1 at a location away from the base region 15. A base electrode is formed in the base region 15. An emitter electrode 23 and a collector electrode 22 are connected to the emitter region 16 and the collector electrode lead-out region 18, and these electrodes are made of the second conductive film comprising the polysilicon film and the TiSi$_2$ film formed thereon, as in the protection film 61. Thus, the second conductive film consists of the collector electrode 22, the emitter electrode 23 and the protection film 61. The collector electrode 22 is connected to a power source potential, and the emitter electrode 23 is connected to a power source potential. Also, the base electrodes is connected to a power source potential.

The base electrode may be formed from the conductive films 27 and 26. In this case, the collector electrode 22 and the emitter electrode 23 are made of metal such as Al.

The collector electrode lead-out region 18 is connected to the N$^+$ impurity diffusion buried region 12 via a deep N$^+$ impurity diffusion region (collector region) 17.

When forming the second conductive film shown in FIG. 10, a conductive layer is 18 formed on the main surface of the semiconductor substrate 1 in its entirety, as in the first embodiment, and the conductive layer is selectively etched, thus forming a conductive film for covering the stepped portion formed by the first conductive film and the stepped portion formed by the end portion of the field oxide film. Then, a predetermined portion of the conductive film is covered by the photoresist 20 and those portions of the conductive film which cover the stepped portions, are removed by etching. After that, the photoresist 20 is removed, and the resultant is subjected to a later step, thus completing a semiconductor device. Since the surface of the insulation film 5 is formed of the Si$_3$N$_4$ film 52 which is not easily etched, the conductive film covering the stepped portions can be effectively etched without being overetched.

The structure of a semiconductor device of the present invention has been described with reference to FIG. 10. Referring to FIG. 10 again, a method of manufacturing the semiconductor device comprising a MOS transistor and a bipolar transistor is described hereinafter. In FIG. 10, the insulation film 5 and the second conductive film are depicted as having a double layer structure. However, in the following description, the insulation film and the conductive film are described as being of a single layer structure for brevity.

An N impurity such as phosphorus P or arsenic As is implanted into a predetermined area of the surface of a P-type semiconductor substrate 10. Next, an N$^-$ epitaxial layer 11 is grown on the semiconductor substrate 10. During this step, a P-type buried layer 12 is formed in that area. A trench is formed in the epitaxial layer 11, which lead to the semiconductor substrate 10. The trench is filled with SiO$_2$, by CVD. Thereafter, a field oxide film 2 of a predetermined pattern is formed on the epitaxial layer 11. The epitaxial layer 1 is divided into a first element portion and a second element portion by the field oxide layer 2 and the insulative trench 28. The second element region is above the buried layer 12. The first element region and the second element region constitute a MOS transistor region and a bipolar transistor region, respectively. Then, a P impurity such as boron B is implanted into the MOS transistor region to form a P well. Next, an N impurity is implanted into the predetermined areas of the P well MOS region to form a source region 14 and a drain region 14, respectively. A gate insulation film 3 is formed on the MOS region. Then, a gate electrode 4 is formed on the gate insulation film 3. Thereafter, an N impurity is highly implanted in a predetermined area of the bipolar transistor region to form an N$^+$ collector region 17 leading to the buried layer 12. Next, a P impurity such as boron B is implanted in the predetermined area of the bipolar transistor region to form a P base region 15. Then, an N impurity is implanted into a predetermined area of the P base region to form an N$^+$ emitter region 16. At this time, the N impurity is also implanted in the collector region 17 to form an N$^+$ collector contact region 18. Thereafter, an insulation film 51 is formed over the gate electrode 4 so as to extend onto the field oxide film 2 between the MOS transistor region and the bipolar transistor region. Next, a conductive layer 27 made of polysilicon is formed over the surface of the semiconductor structure. Then, resist patterns are formed on those portions of the conductive layer, which are on the MOS transistor region, the end portion of the insulation film 51, and the emitter region 16, to cover the portions. Next, the conductive layer is etched by an unisotropic etching, using the resist pattern as a mask. Then, the resist patterns are removed. Thereafter, a resist pattern is formed over the bipolar transistor region and the end portion of the insulation film. Then, the conductive layer on the MOS region is etched by an isotropic etching, using the resist pattern as a mask.

As described above, the end portion of the insulation film for covering the gate electrode, which is the first conductive film, formed on the MOS transistor portion, is covered by the protection film, which is the second conductive film, obtained by patterning the conductive layer formed on the entire surface of the semiconductor substrate. The protection film 61 prevents the end portion of the insulation film 5 from being stressed. The protection film 61 also functions as a protection film for preventing the peel-off of the end portion of the insulation film 5. The film 61 is electrically floating. The protection film 61 extents onto the upper surface of the insulation film 5 to carry out the function as a protection film. Further, the film 61 extends onto the field oxide film 2 to have a support for itself to the semiconductor device. With the protection film 61, the insulation film is prevented from being stressed and does not easily peels off from the surface of the semiconductor substrate, thus reducing the defective product rate.

The above embodiments were explained in connection with the case where an epitaxial wafer was used. However, the present invention is not limited to such a case, but any type of presently available Si or Ge wafer can be used. Further, the semiconductor substrate may be of either P-type or N-type, and a PNP transistor can be used as a bipolar transistor.

With the present invention, the insulation film is prevented from stress and does not easily peel off, and therefore the product device can be made stable in structure and electrical operation. Consequently, a semiconductor device in which integrated circuits of different types, for example, a MOS integrated circuit and a bipolar integrated circuit, can be obtained at a high good product rate. Further, when the conductive film formed on the insulation film for covering the semiconductor substrate is patterned into an electrode or a wiring portion, residue of the conductive film, which may be formed on the side wall of the stepped portion created on the insulation film, is not generated. Therefore, the conductive film can be accurately patterned despite an increasing number of stepped portions created on the surface of the insulation film along with an increase in degree of integration of the semiconductor device, and downsizing thereof.

Since the end portion of the insulation film for covering the first conductive film used for a wiring portion or an electrode, is protected by the protection film which constitutes the second conductive film formed on this first conductive film, the conductive film is prevented from stress and does not easily peels off from the semiconductor substrate. The conductive layer formed on the entire surface of the semiconductor device is patterned so that the stepped portions created in the insulation film and the end portion of the insulation film are covered. Later, the anisotropic etching is carried out so as to avoid the formation of side wall residue of the second conductive film on the stepped portions created by covering the first conductive film and the field oxide film.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate having a first element region, a second element region, and an intervening region between the first element region and the second element region;
   a first insulation film formed on said intervening region of said semiconductor substrate:
   a second insulation film formed on said first element region of said semiconductor substrate, the second insulation film extending to a portion of said intervening region and having an end on said portion of the intervening region;
   a conductive film formed on said end of said second insulation film and extending onto said first insulation film and said second insulation film; and
   a wiring film formed on said second element region, said wiring film and said conductive film being formed by patterning a common film, and said wiring film and said conductive film being electrically insulated from each other.

2. A semiconductor device according to claim 1, wherein said conductive film is electrically floating.

3. A semiconductor device according to claim 1, wherein said second insulation film comprises a SiN film.

4. A semiconductor device comprising:
   a semiconductor substrate having a first element region and a second element region;
   an insulation film formed on said first element region of said semiconductor substrate, having an end portion extending to a region of said semiconductor substrate which is between said first element region and said second element region;
   a conductive film formed on said end portion, extending onto said insulation film and said semiconductor substrate, said conductive film surrounding said first element region; and a wiring film formed on said second element region, said wiring film and said conductive film being formed by patterning a common film, and said wiring film and said conductive film being electrically insulated from each other.

5. A semiconductor device according to claim 4, wherein said first element region is nearer a center of said semiconductor substrate than said second element region is.

6. A semiconductor device according to claim 1, wherein said conductive film comprises a polysilicon film.

7. A semiconductor device according to claim 1, wherein said conductive film comprises a single film.

8. A semiconductor device according to claim 7, wherein said single film comprises one selected from the group consisting of a polysilicon film, a refractory metal film, a metal film, and a silicide film.

9. A semiconductor device comprising;
   a semiconductor substrare;
   a semiconductor layer formed on said semiconductor substrate, said semiconductor layer including a MOS transistor region and a bipolar transistor region;
   a buried layer formed between said semiconductor substrate and said semiconductor layer;
   an isolation film pattern formed on said semiconductor layer;
   a source and a drain regions formed in said MOS transistor region of said semiconductor layer;
   a first conductive film pattern formed in said MOS transistor region of said semiconductor layer, forming a gate electrode;
   an insulative film pattern formed on said MOS transistor region of said semiconductor layer, covering said first conductive film pattern and having an end portion extending to said isolation film pattern; and
   a second conductive film pattern having a first conductive portion and a second conductive portion electrically disconnected to each other, said first conductive portion being formed on said bipolar transistor region of said semiconductor layer and said second conductive portion being formed on said isolation film pattern, said first conductive portion forming a base electrode and being connected to a power source potential, and said second conductive portion covering said end portion of said insulative film pattern and being electrically floating.

10. A semiconductor device according to claim 9, wherein said isolation film is a field oxide film.

11. A semiconductor device comprising:
    a semiconductor substrate;
    a semiconductor layer formed on said semiconductor substrate, said semiconductor layer including a MOS transistor region and a bipolar transistor region;

a buried layer formed between said semiconductor substrate and said semiconductor layer;

an isolation film pattern formed on said semiconductor layer;

a source and a drain regions formed in said MOS transistor region of said semiconductor layer;

a first conductive film pattern formed in said MOS transistor region of said semiconductor layer, forming a gate electrode;

a first insulative film pattern formed on said MOS transistor region of said semiconductor layer, covering said first conductive film pattern and having an end portion extending to said isolation film pattern;

a second insulative film pattern formed on said MOS transistor region, covering said first insulative film;

a second conductive film pattern having a first conductive portion and a second conductive portion electrically disconnected to each other, said first conductive portion being formed on said bipolar transistor region of said second semiconductor layer and said second conductive portion being formed on said isolation film pattern, said first conductive portion forming a base electrode and being connected to a power source potential, and said second conductive portion covering said end portion of said insulative film pattern and being electrically floating;

a third conductive film pattern having a third conductive portion and a fourth conductive portion, said third conductive portion and said fourth conductive portion being formed on said first conductive portion and said second conductive portion, covering said first conductive portion and said second conductive portion, respectively; and a third insulative film pattern having a first insulative portion and a second insulative portion, said first insulative portion and said second insulative portion being formed on said third conductive portion and said fourth conductive portion, covering said third conductive portion and said fourth conductive portion, respectively.

12. A semiconductor device according to claim 11, wherein said isolation film is a field oxide film.

13. A semiconductor device comprising:

a semiconductor substrate;

a semiconductor layer formed on said semiconductor substrate, said semiconductor layer including a MOS transistor region and a bipolar transistor region;

a buried layer formed between said semiconductor substrate and said semiconductor layer;

an isolation film pattern formed on said semiconductor layer;

a source and a drain regions formed in said MOS transistor region of said semiconductor layer;

a first conductive film pattern formed in said MOS transistor region of said semiconductor layer, forming a gate electrode;

an insulative film pattern formed on said MOS transistor region of said semiconductor layer, covering said first conductive film pattern and having an end portion extending to said isolation film pattern; and a second conductive film pattern having a first conductive portion, a second conductive portion and a third conductive portion electrically disconnected to each other, said first and said second conductive portions being formed on said bipolar transistor region of said semiconductor layer and said third conductive portion being formed on said isolation film pattern, said first conductive portion forming a collector electrode and being connected to a power source potential, said second conductive portion forming an emitter electrode and being connected to a power source potential, and said third conductive portion covering said end portion of said insulative film pattern and being electrically floating.

14. A semiconductor device comprising:

a semiconductor substrate;

a semiconductor layer formed on said semiconductor substrate, said semiconductor layer including a MOS transistor region and a bipolar transistor region;

a buried layer formed between said semiconductor substrate and said semiconductor layer;

an isolation film pattern formed on said semiconductor layer;

a source and a drain regions formed in said MOS transistor region of said semiconductor layer;

a first conductive film pattern formed in said MOS transistor region of said semiconductor layer, forming a gate electrode;

a first insulative film pattern formed on said MOS transistor region of said semiconductor layer, covering said first conductive film pattern and having an end portion extending to said isolation film pattern;

a second insulative film pattern formed on said MOS transistor region, covering said first insulative film;

a second conductive film pattern having a first conductive portion, a second conductive portion and a third conductive portion electrically disconnected to each other, said first and said second conductive portions being formed on said bipolar transistor region of said second semiconductor layer and said third conductive portion being formed on said isolation film pattern, said first conductive portion forming a collector electrode and being connected to a power source potential, said second conductive portion forming an emitter electrode and being connected to a power source potential, and said third conductive portion covering said end portion of said insulative film pattern and being electrically floating;

a third conductive film pattern having a fourth conductive portion, a fifth conductive portion and sixth conductive portion, said fourth conductive portion said fifth conductive portion and said sixth conductive portion being formed on said first conductive portion, said second conductive portion and said third conductive portion, covering said first conductive portion, said second conductive portion and said third conductive portion, respectively; and a third insulative film pattern having a first insulative portion, a second insulative portion and a third insulative portion, said first insulative portion, said second insulative portion and said third insulative portion being formed on said fourth conductive portion, said fifth conductive portion and said sixth conductive portion, covering said fourth conductive portion, said fifth conductive portion and said sixth conductive portion, respectively.

\* \* \* \* \*